(12) United States Patent
Park

(10) Patent No.: US 7,782,704 B2
(45) Date of Patent: Aug. 24, 2010

(54) COLUMN DECODER AND SEMICONDUCTOR MEMORY APPARATUS USING THE SAME

(76) Inventor: Mun-Phil Park, San 136-1, Ami-ri, Bubal-eub, Ichon-shi, Gyeonggi-do (KR) 467-860

( * ) Notice: Subject to any disclaimer, the term of this patent is extended or adjusted under 35 U.S.C. 154(b) by 312 days.

(21) Appl. No.: 11/826,650

(22) Filed: Jul. 17, 2007

(65) Prior Publication Data

US 2008/0253218 A1      Oct. 16, 2008

(30) Foreign Application Priority Data

Apr. 11, 2007      (KR) .................. 10-2007-0035492

(51) Int. Cl.
*G11C 8/00* (2006.01)
(52) U.S. Cl. ............... 365/230.06; 365/230.03; 365/233.13; 365/189.14
(58) Field of Classification Search ........... 365/230.06, 365/230.03, 233.13, 189.14
See application file for complete search history.

(56) References Cited

U.S. PATENT DOCUMENTS

| 6,101,147 | A | 8/2000 | Takahashi et al. |
| 6,456,558 | B1 | 9/2002 | Cho |
| 6,819,623 | B2 | 11/2004 | Jung |
| 7,583,557 | B2 * | 9/2009 | Do .................. 365/230.05 |

FOREIGN PATENT DOCUMENTS

| JP | 9-45083 | 2/1997 |
| KR | 1020050067513 | 7/2005 |

\* cited by examiner

*Primary Examiner*—Hoai V Ho
*Assistant Examiner*—Fernando N Hildalgo
(74) *Attorney, Agent, or Firm*—Venable LLP; Jeffri A. Kaminski

(57) ABSTRACT

A column decoder includes: a plurality of main decoding units coupled to different memory banks that decode a pre-decoding signal and output column selection signals to the corresponding memory banks; and one or more pre-decoders, having a lesser number than the main decoders, which generates and outputs the pre-decoding signal by decoding the column address and the bank information signal.

8 Claims, 10 Drawing Sheets

[FIG. 4]
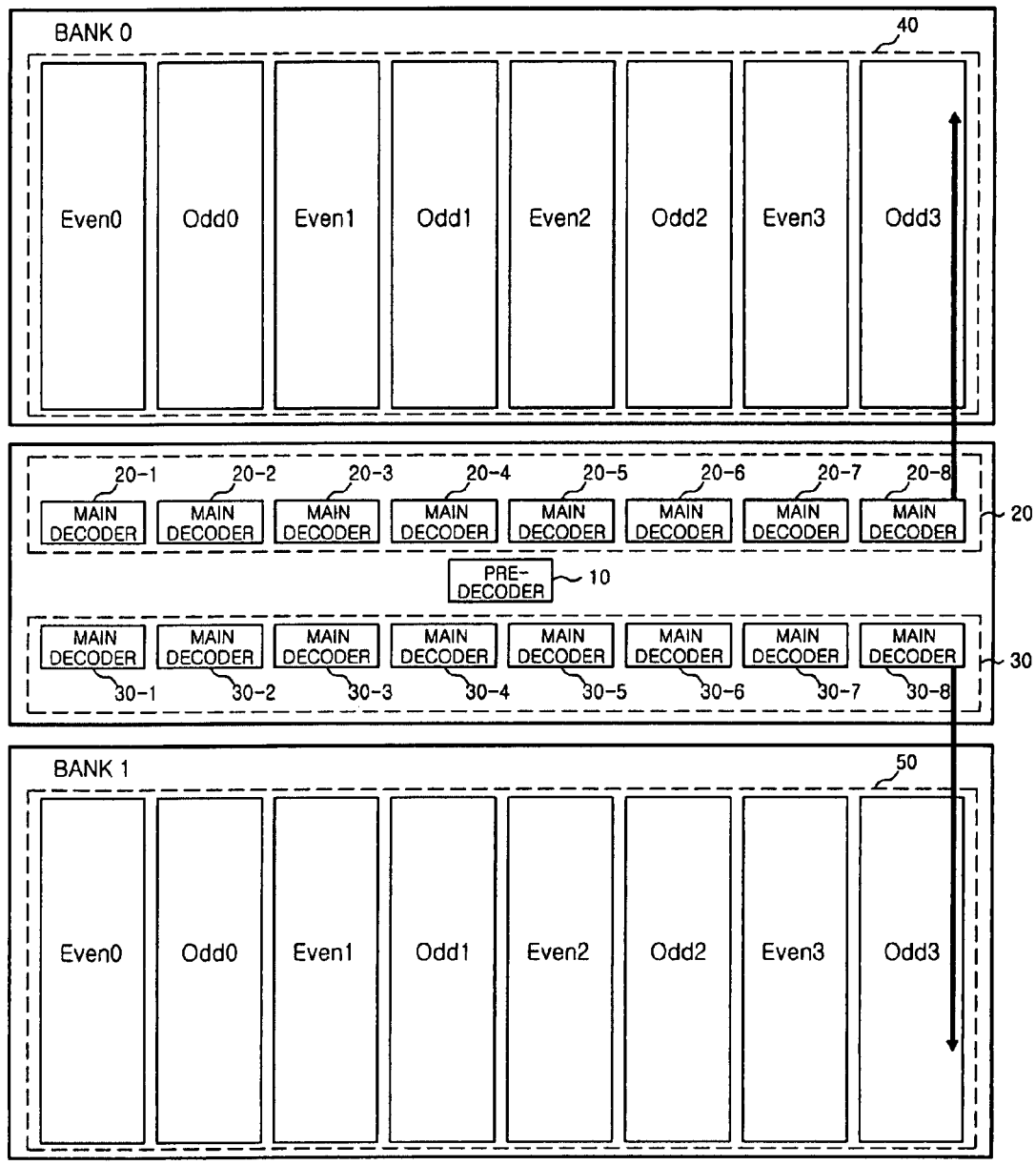

[FIG. 5]
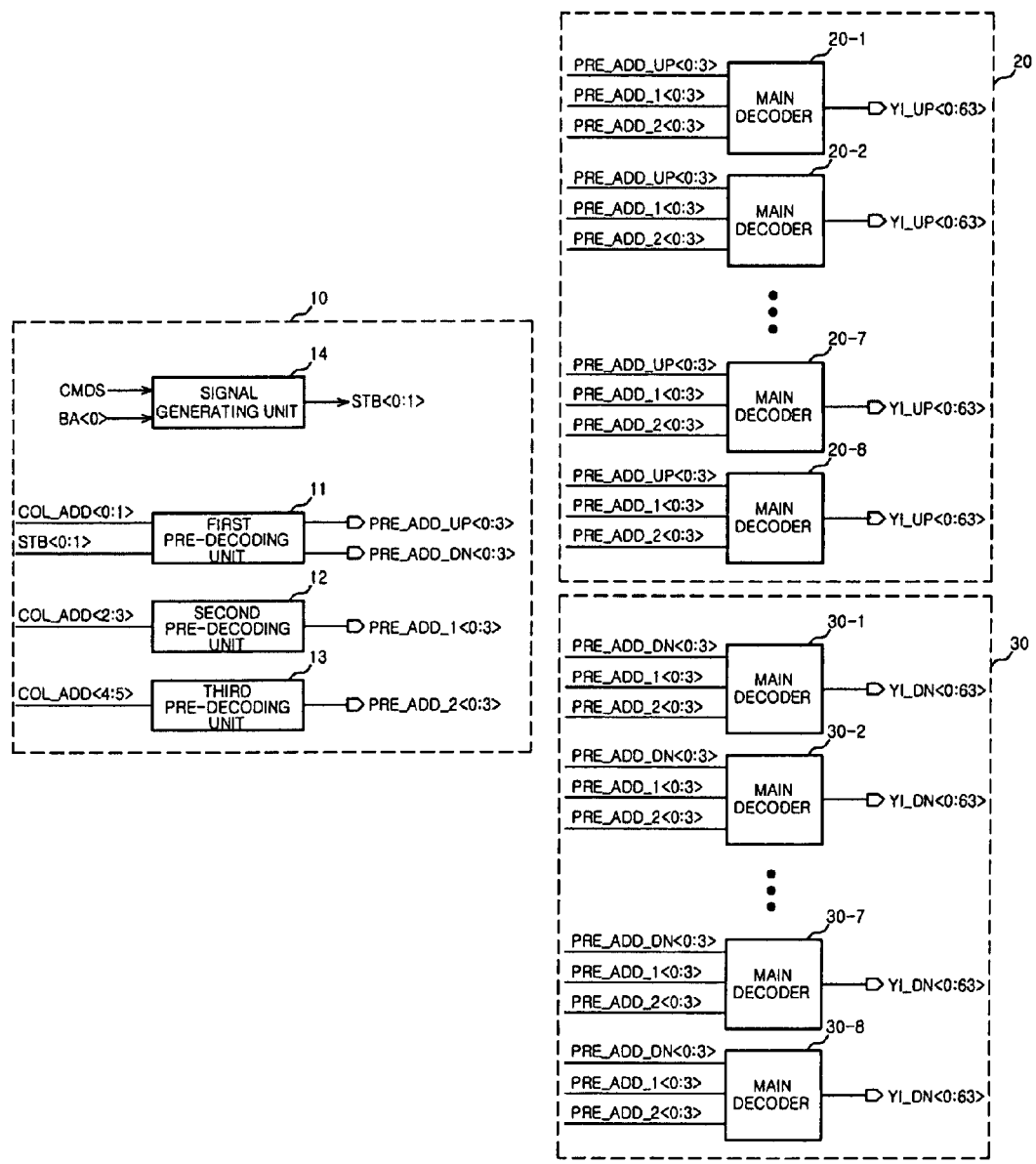

[FIG. 6]
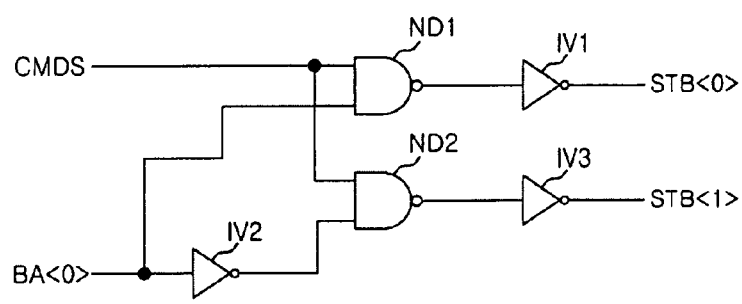
[FIG. 7]
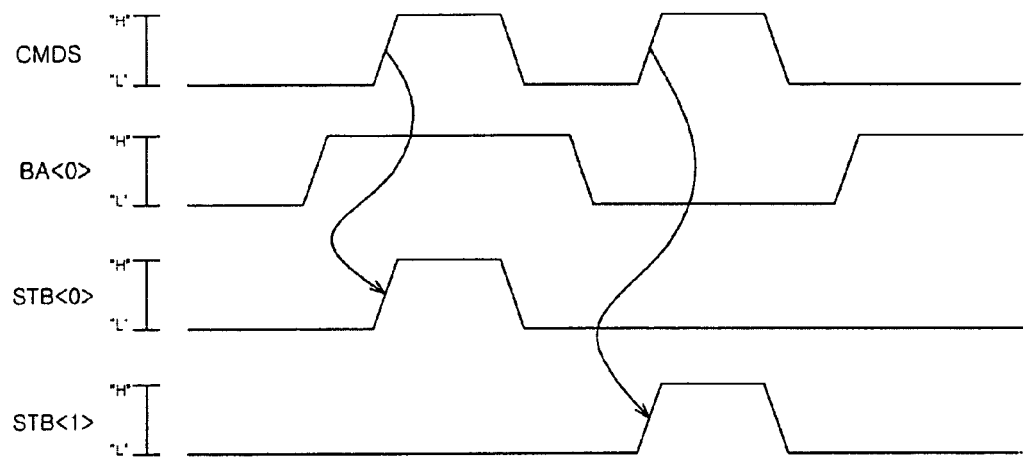

[FIG. 8]
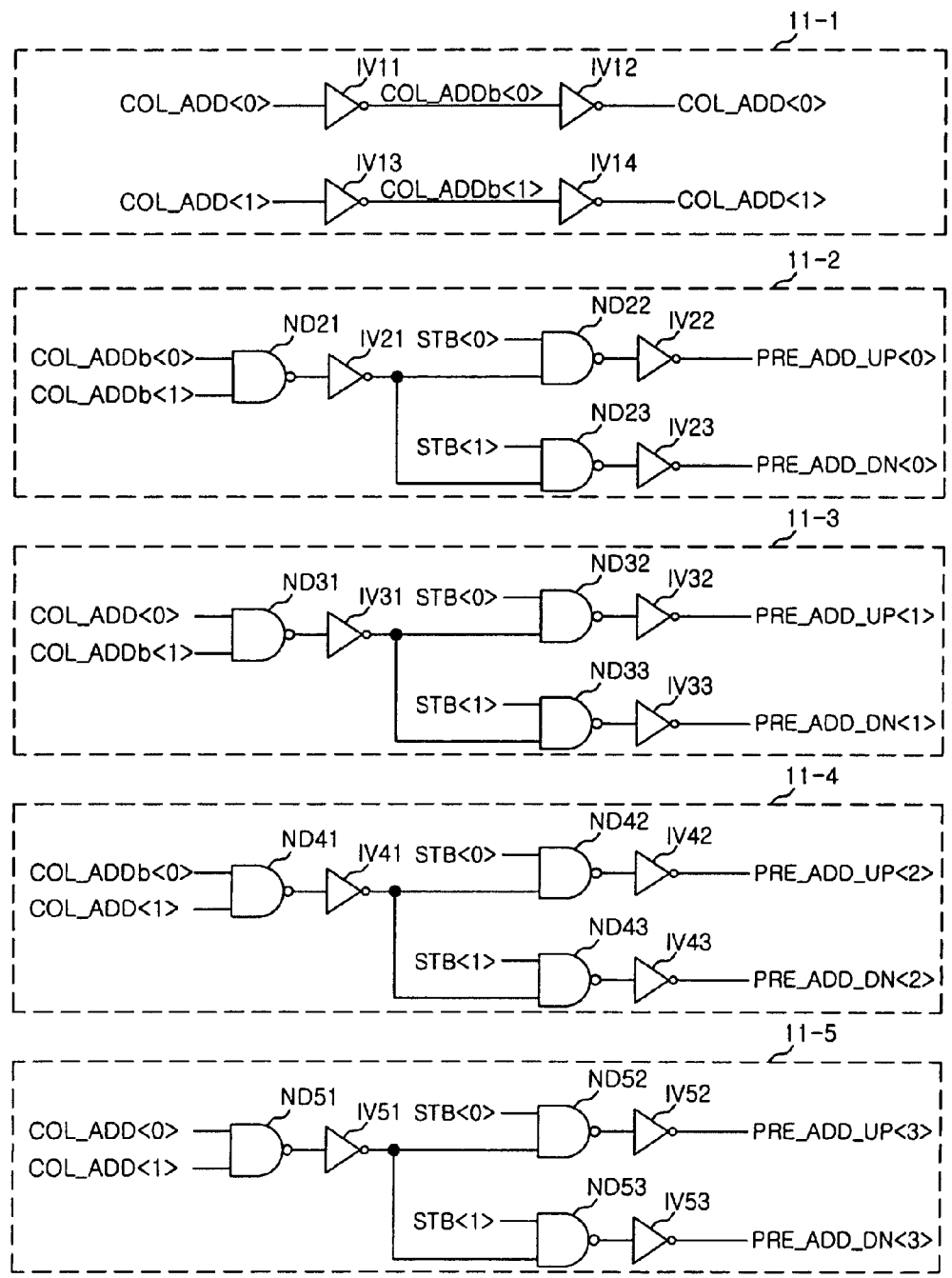

[FIG. 9]
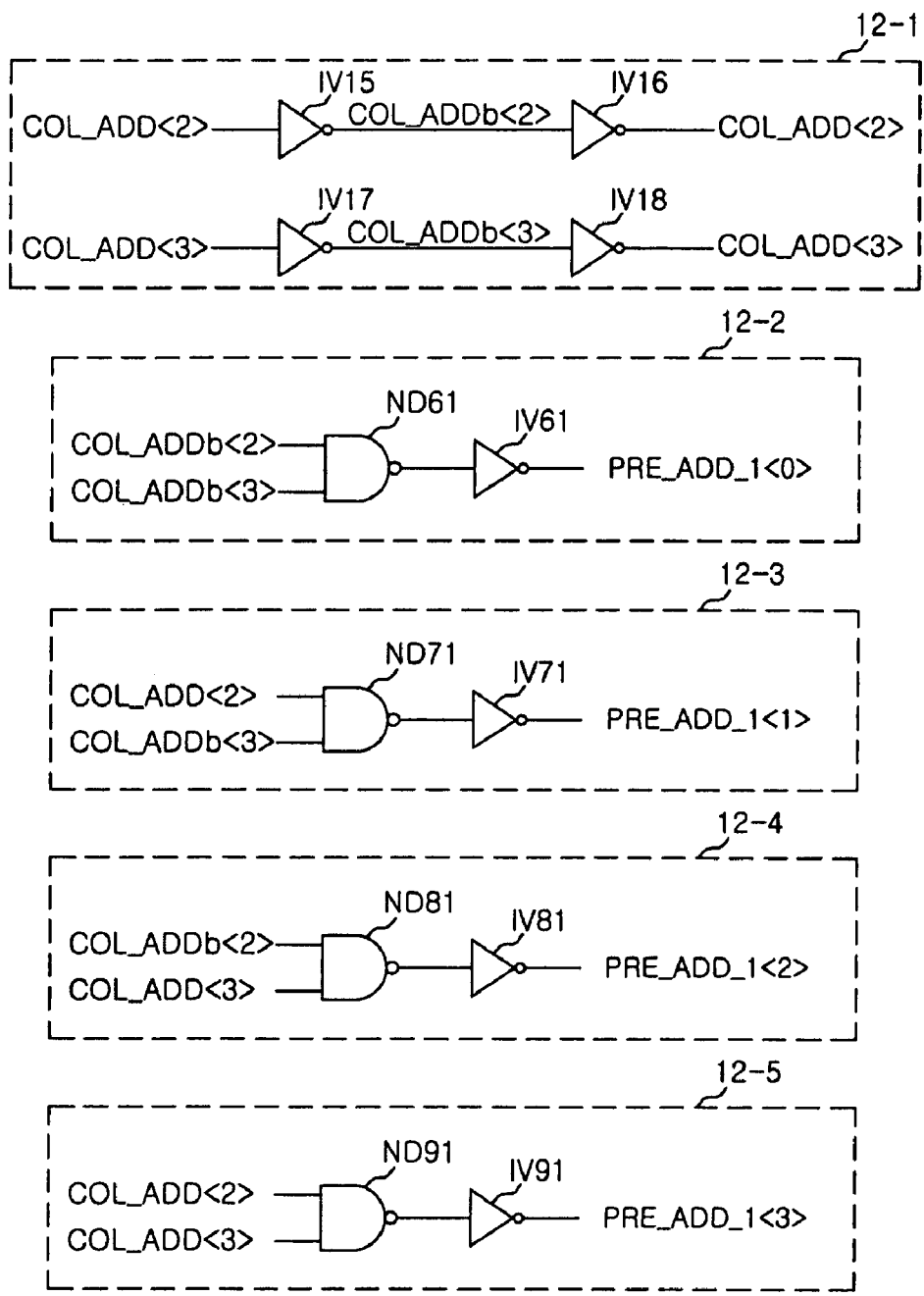

[FIG. 10]
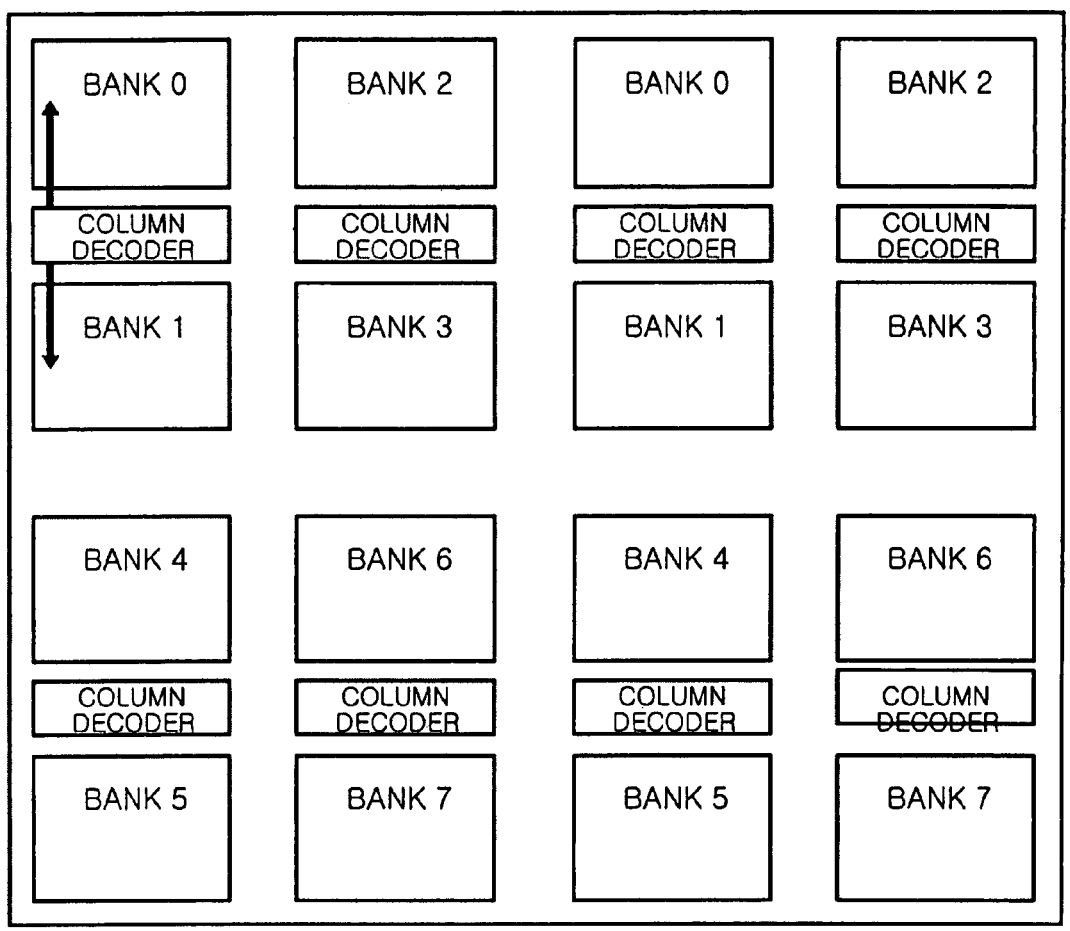

[FIG. 11]
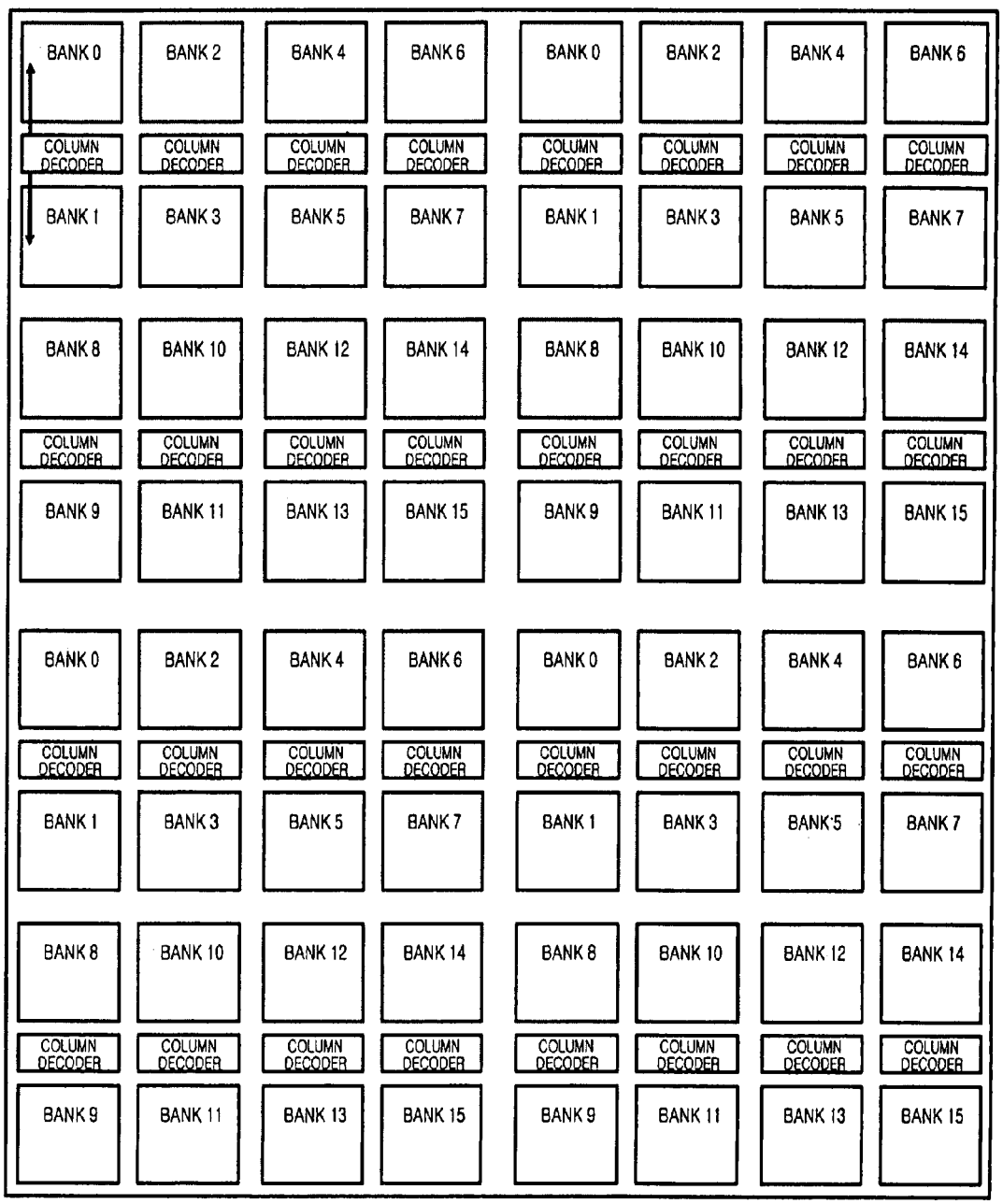

COLUMN DECODER AND SEMICONDUCTOR MEMORY APPARATUS USING THE SAME

CROSS-REFERENCE TO RELATED PATENT APPLICATION

This application claims the benefit of Korean Patent Application No. 10-2007-0035492, filed on Apr. 11, 2007, in the Korean Intellectual Property Office, the disclosure of which is incorporated herein in its entirety by reference.

BACKGROUND OF THE INVENTION

1. Technical Field

Embodiments of the present invention relate to semiconductor technology, and more particularly, to a column decoder that decodes column addresses and outputs column selection signals and to a semiconductor memory apparatus using the same.

2. Related Art

In general, semiconductor memory apparatuses include column decoders that decode a plurality of column addresses. A memory bank includes a plurality of segments each having a column decoder provided therein. Each column decoder includes a pre-decoder that divides the plurality of column addresses by a predetermined number and performs a pre-decoding operation on the divided column addresses, and a main decoder that decodes the column addresses which have been pre-decoded by the pre-decoder to output column selection signals. The segment is a divided memory region from which a one-bit data is read. The segment is the smallest unit into which the column address is divided.

The column decoder includes one pre-decoder and one corresponding main decoder.

FIG. 1 shows a conventional semiconductor memory having an eight-bank structure. In this structure, each of the eight banks has a half-bank structure, i.e., each bank is divided into two half banks. In FIG. 1, two different arrangements (typeA and typeB) of column decoders have been depicted.

In the case of the first arrangement typeA, one column decoder that outputs column selection signals to each of the half banks is arranged below each of the half banks. In the case of the second arrangement typeB, two column decoders are arranged between two half banks.

FIG. 2 depicts a typeA arrangement of column decoders with respect to memory banks, where one column decoder is arranged below each of the half banks. Assuming that each half bank includes eight segments Even0, Odd0, Even1, Odd1, Even2, Odd2, Even3, and Odd3 for an 8-bit prefetch, one main decoder and one pre-decoder are allocated to each of the segments.

The total number of pre-decoders in a memory apparatus is calculated as the number of half banks*the number of banks*the number of segments. For example, in a DDR3 in which there are sixteen data input/output buffers, the number of pre-decoders is equal to 2*8*8=128. As shown in FIG. 2, the number of main decoders is also 128.

FIG. 3 depicts a typeB arrangement of column decoders, where two column decoders are arranged between two half bank, each column decoder outputting column selection signals to each of the half banks. When the half bank includes eight segments for an 8-bit prefetch, one main decoder and one pre-decoder are allocated to each of the segments.

For example, in a DDR3 having sixteen data input/output buffers, the number of pre-decoders equal to the number of half banks*the number of banks*the number of segments (2*8*8=128). As shown in FIG. 3, the number of main decoders is also 128.

In a conventional semiconductor memory apparatus described above, when a bank is arranged as two half banks, a column decoder including a main decoder and a corresponding pre-decoder is provided for each of the half-banks. As a result, the area of the semiconductor memory apparatus dedicated to the decoders increases.

Further, in the conventional semiconductor memory apparatus having a quarter-bank structure, i.e., having one bank divided into four quarter banks, a column decoder including a main decoder and a corresponding pre-decoder is provided for each of the quarter-banks. Therefore, the number of main decoders and pre-decoders are twice as many as those in the half-bank structure, thus further increasing the area of the semiconductor memory apparatus.

As the number of banks of the semiconductor memory apparatus increases or banks are divided into sub-banks, the number of column decoders including main decoders and pre-decoders needed in the apparatus also increase. Further, as more column decoders are needed, more lines are also needed to connect to the pre-decoders and transmit the column addresses. Therefore, the area of the semiconductor memory apparatus increases, and, as a result, cell efficiency decreases.

SUMMARY

Embodiments of the present invention may provide a column decoder having a small area and a semiconductor memory apparatus using the same that has a small area.

According to an embodiment of the invention, a column decoder may include: a plurality of main decoding units that may be connected to different memory banks, decode pre-decoding signals, and output column selection signals to the corresponding memory banks; and one or more pre-decoder that may be less than the number of main decoders of the plurality of main decoding signals, and output the pre-decoding signals obtained by decoding column addresses and bank information signals such that the plurality of main decoding units selectively use the output pre-decoding signals.

According to another embodiment of the invention, a column decoder may include: at least one pre-decoder that may decode bank information signals and column addresses and output pre-decoding signals to one of two different memory banks corresponding to the bank information signal; and a plurality of main decoders that may decode the pre-decoding signals and output an up column selection signal or a down column selection signal. Here, the at least one pre-decoder and the plurality of main decoders may be provided between the two different memory banks.

According to still another embodiment of the invention, a semiconductor memory apparatus may include: a first memory bank; a second memory bank; and a bank shared column decoder that may include at least one pre-decoder and a plurality of main decoders sharing the at least one pre-decoder, decode bank information signals and column addresses, and selectively activate column paths of the first memory bank and the second memory bank according to the decoded result.

BRIEF DESCRIPTION OF THE DRAWINGS

FIG. 4 is a block diagram illustrating an exemplary structure of a semiconductor memory apparatus according to an embodiment of the present invention.

FIG. 5 is a block diagram illustrating an exemplary column decoder according to an embodiment of the present invention.

FIG. 6 is an exemplary circuit diagram illustrating an exemplary signal generating unit shown in FIG. 5, according to an embodiment of the present invention.

FIG. 7 is a timing diagram illustrating an example of the operation of the signal generating unit shown in FIG. 6, according to an embodiment of the present invention.

FIG. 8 is an exemplary circuit diagram illustrating a first pre-decoding unit shown in FIG. 5, according to an embodiment of the present invention.

FIG. 9 is an exemplary circuit diagram illustrating a second pre-decoding unit shown in FIG. 5, according to an embodiment of the present invention.

FIG. 10 is an exemplary block diagram illustrating column decoders in a semiconductor memory apparatus having an eight-bank structure, each bank including a half-bank arrangement, according to an embodiment of the present invention.

FIG. 11 is an exemplary block diagram illustrating column decoders in a semiconductor memory apparatus having a sixteen-bank structure, each bank including a quarter-bank arrangement, according to still another embodiment of the present invention.

DETAILED DESCRIPTION

Figure 1:
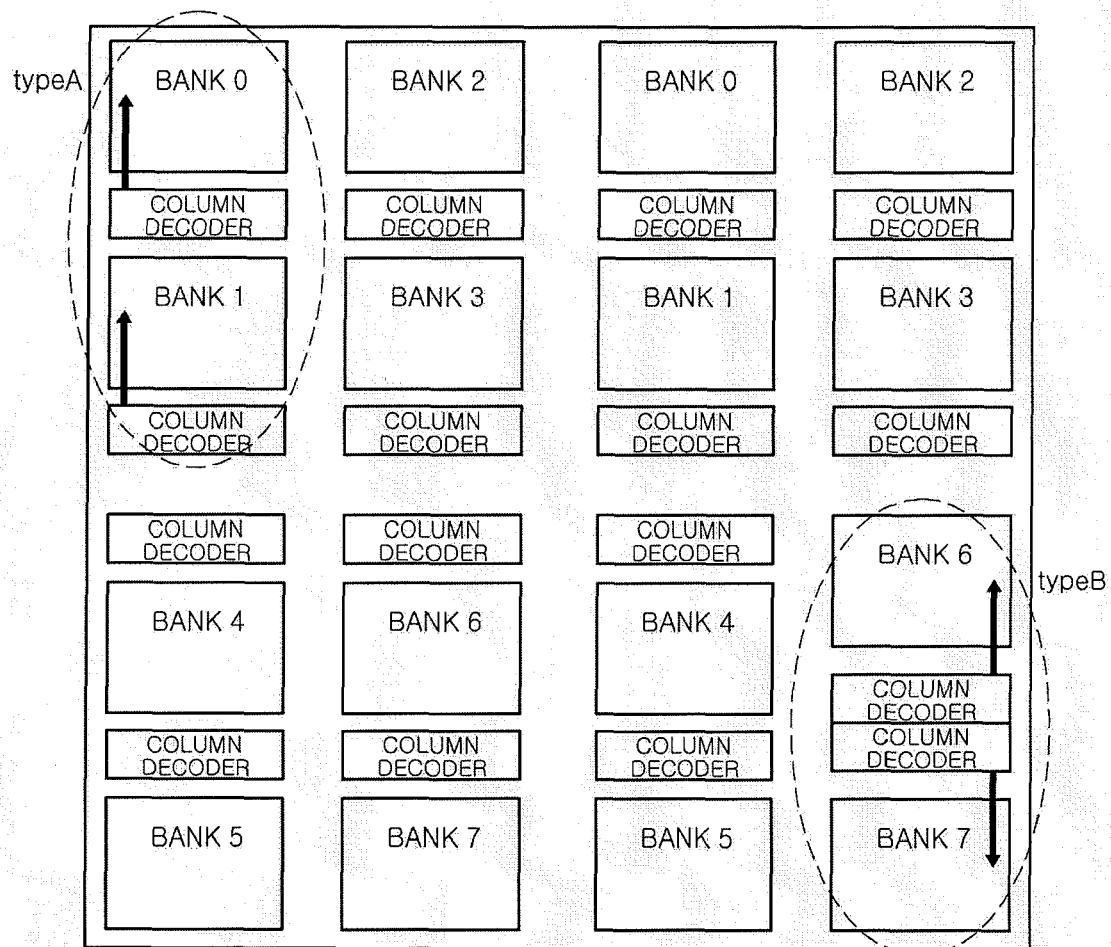
FIG. 1 is an exemplary structural diagram illustrating a conventional arrangement of column decoders of a semiconductor memory apparatus having an eight-bank structure according.
Figure 2:
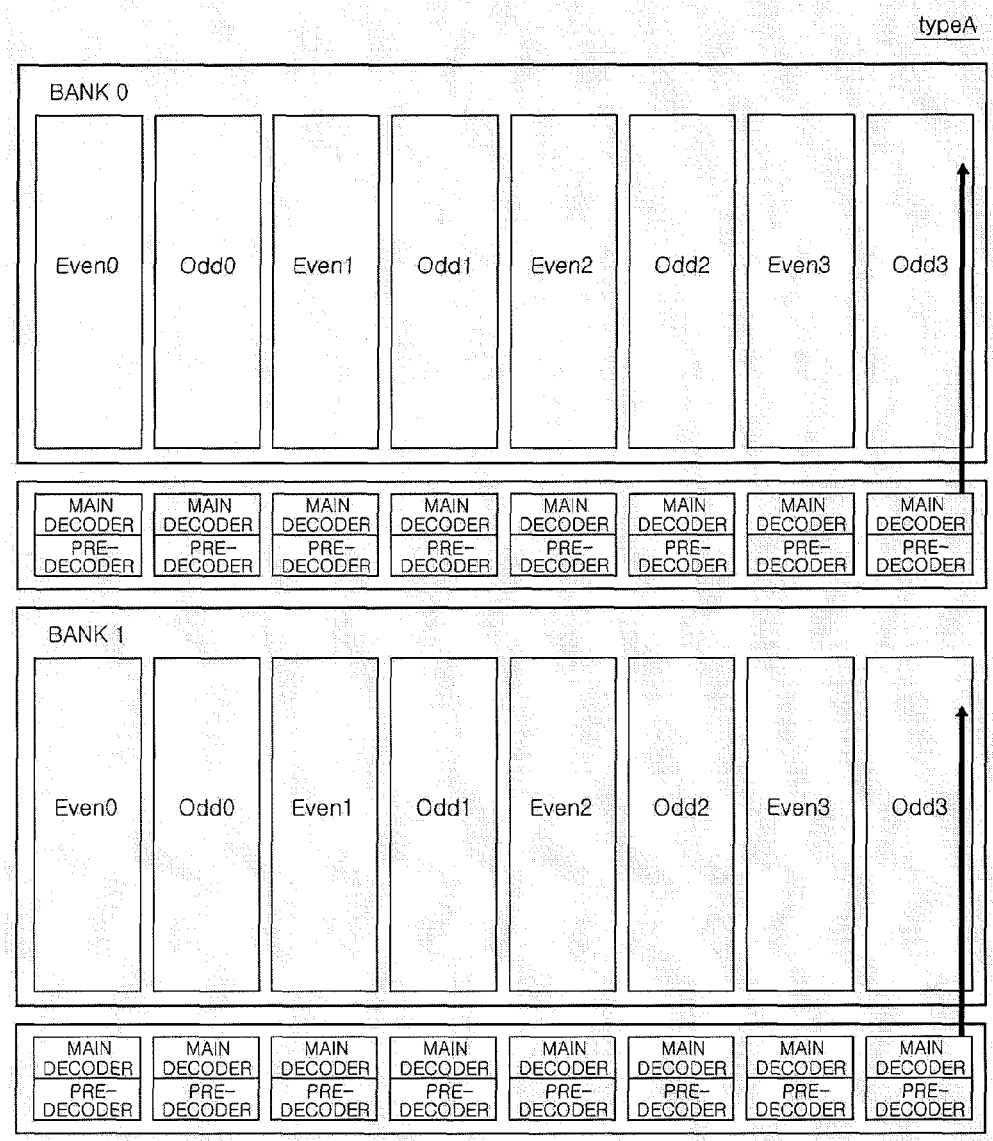
FIG. 2 is an exemplary block diagram illustrating the structure of a first arrangement (type A) of column decoders shown in FIG. 1.
Figure 3:
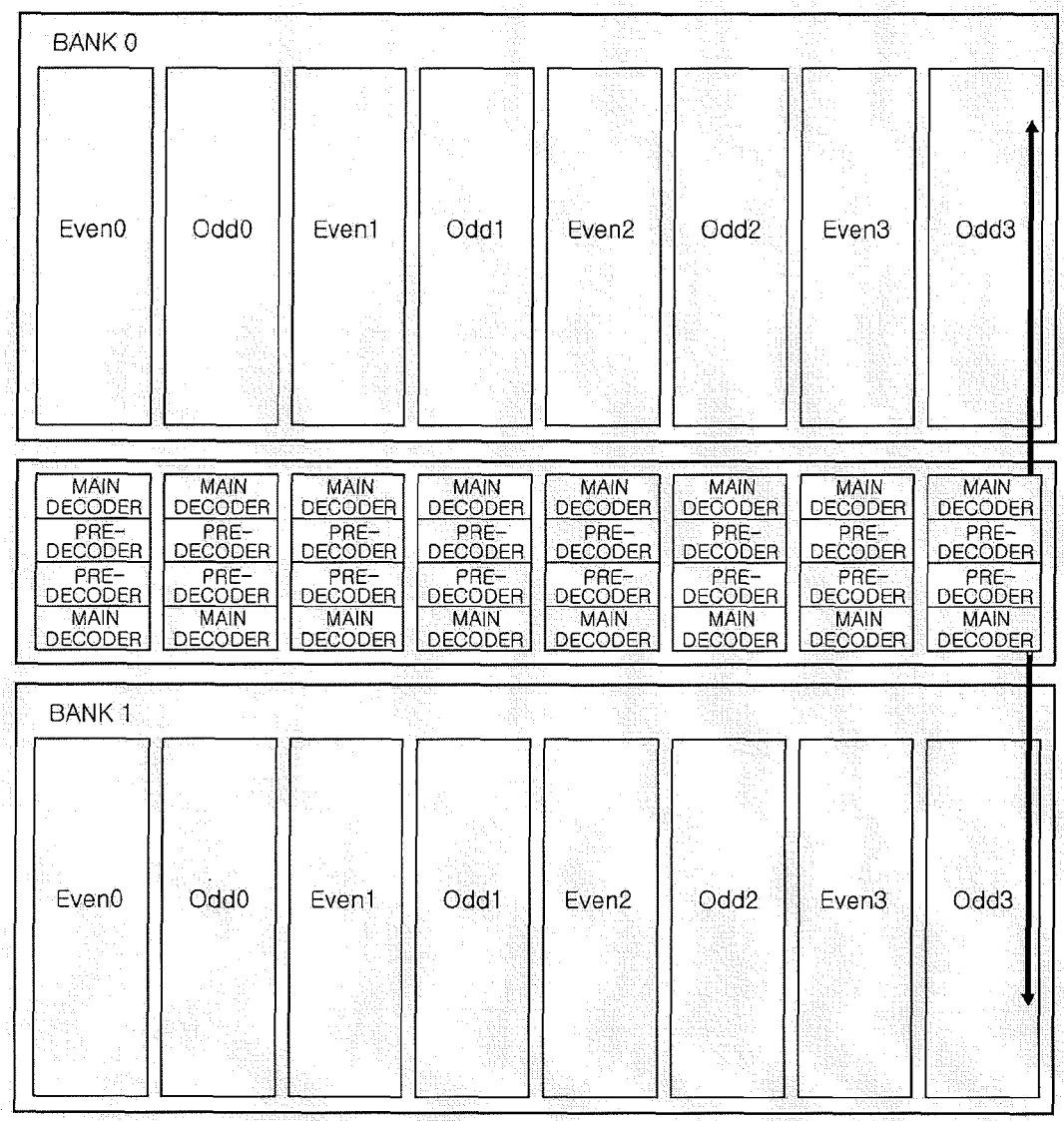
FIG. 3 is an exemplary block diagram illustrating the structure of a second arrangement (type B) of column decoders shown in FIG. 1.

A column decoder and a semiconductor memory apparatus including the same will now be described in detail according to exemplary embodiments of the present invention with reference to the accompanying drawings.

Referring to FIG. 4, there is shown a semiconductor memory apparatus which includes, according to an exemplary embodiment of the invention, two banks, BANK0, BANK1, each of which includes eight segments Even0, Odd0, Even1, Odd1, Even2, Odd2, Even3, and Odd3 for an 8-bit prefetch,. A column decoder may be provided between BANK0 and BANK1, which may share the column decoder.

According to an exemplary embodiment, a first segment group 40 may be provided in BANK0, which may include a plurality of segments Even0, Odd0, Even1, Odd1, Even2, Odd2, Even3, and Odd3.

Similarly, a second segment group 50 may be provided in the first bank BANK1, which may include a plurality of segments Even0, Odd0, Even1, Odd1, Even2, Odd2, Even3, and Odd3.

According to an embodiment of the invention, the column decoder includes a pre-decoder 10, a first main decoding unit 20, and a second main decoding unit 30.

The first main decoding unit 20 includes a plurality of main decoders, which may be, for example, eight main decoders 20-1 to 20-8. The second main decoding unit 30 includes a plurality of main decoders, which may be, for example, eight main decoders 30-1 to 30-8.

The first main decoding unit 20 and the second main decoding unit 30 share the pre-decoder 10. Thus, the pre decoder 10 supplies pre-decoded column addresses to all of the main decoders of the first main decoding unit 20 and the second main decoding unit 30.

A conventional decoder, as previously discussed, typically includes the same number of main decoders as there are segments in each bank BANK0 and BANK1. The main decoders may be connected to the corresponding pre-decoders and receive output signals. However, in the column decoder of the semiconductor memory apparatus according to the embodiment of the present invention depicted in FIG. 4, a plurality of main decoders receive a pre-decoding signal from the one pre-decoder 10 and decode that pre-decoding signal.

In the exemplary embodiment depicted in FIG. 4, the column decoder includes one pre-decoder 10 and the sixteen main decoders 20-1 to 30-8. Thus, the ratio of the pre-decoder and the main decoders that constitute one column decoder is 1:16. However, the present invention is not limited to this ratio. For example, the ratio of the pre-decoders to the main decoders may be 2:16, 4:16, etc. Further, in the conventional decoder, each of the banks includes one column decoder, and in the column decoder, the pre-decoder has a one-to-one correspondence with the main decoder. However, in the embodiment of the present invention discussed herein, the ratio of column decoders to banks may be one-to-many, and the ratio of pre-decoders to main decoders of each of the column decoders may be one-to-many. Various modifications of this embodiment can be made by designers.

Referring now to FIG. 5, according to an embodiment of the invention, an exemplary column decoder includes an exemplary pre-decoder 10 that may decode a two-bit bank information signal STB<0:1> and a six-bit column address COL_ADD<0:5> and output a bank identifying pre-decoding signal (i.e., an up pre-decoding signal PRE_ADD_UP<0:3> and a down pre-decoding signal PRE_ADD_DN<0:3>), and a bank common pre-decoding signal (i.e., a first pre-decoding signal PRE_ADD_1<0:3> and a second pre-decoding signal PRE_ADD_2<0:3>). The exemplary column decoder also includes an exemplary first main decoding unit 20 may decode the first pre-decoding signal PRE_ADD_1<0:3>, the second pre-decoding signal PRE_ADD_2<0:3>, and the up pre-decoding signal PRE_ADD_UP<0:3> and may output an up column selection signal YI_UP<0:63>. Finally, the exemplary column decoder includes an exemplary second main decoding unit 30 that may decode the first pre-decoding signal PRE_ADD_1<0:3>, the second pre-decoding signal PRE_ADD_2<0:3>, and the down pre-decoding signal PRE_ADD_DN<0:3> and may output a down column selection signal YI_DN<0:63>.

In an exemplary embodiment, the pre-decoder 10 may include an exemplary first pre-decoding unit 11 that decodes the bank information signal STB<0:1> and the column address COL_ADD<0:1> and outputs the up pre-decoding signal PRE_ADD_UP<0:3> and the down pre-decoding signal PRE_ADD_DN<0:3>; an exemplary second pre-decoding unit 12 that decodes the column address COL_ADD<2:3> and outputs the first pre-decoding signal PRE_ADD_1<0:3>; an exemplary third pre-decoding unit 13 that decodes two the column address COL_ADD<4:5> and outputs the second pre-decoding signal PRE_ADD_2<0:3>; and a signal generating unit 14 that generates the bank information signal STB<0:1> according to a command strobe signal CMDS and a bank address BA<0>.

According to an embodiment of the invention, the bank information signal STB<0:1> may be generated using the command strobe signal CMDS and the bank address BA<0>. In an exemplary embodiment, the bank information signal STB<0> of the bank information signal STB<0:1> may be activated when BANK0 is selected, and the bank information signal STB<1> may be activated when BANK1 is selected. The bank information signals STB<0:1> are shown as an example. In other embodiment, a semiconductor memory apparatus having an eight-bank structure may generate a bank information signal STB<0:7>, and a semiconductor memory apparatus having a sixteen-bank structure may generate bank information signals STB<0:15>.

Referring now to FIG. 6, the signal generating unit 14, according to an embodiment of the invention, may include a first NAND gate ND1 that receives the command strobe signal CMDS and the bank address BA<0>, a first inverter IV1 that receives output of the first NAND gate ND1 and outputs the bank information signal STB<0>, a second inverter IV2 that receives the bank address BA<0>, a second NAND gate ND2 that receives the command strobe signal CMDS and the bank address BA<0> inverted by the second inverter IV2, and a third inverter IV3 that receives the output of the second NAND gate ND2 and outputs the bank information signal STB<1>.

As shown in FIG. 7, the exemplary signal generating unit 14 generates the bank information signal STB<0> using the command strobe signal CMDS that may be generated during a period for which the bank address BA<0> is at a high level, and the bank information signal STB<1> using the command strobe signal CMDS that may be generated during a period for which the bank address BA<0> is at a low level.

According to an embodiment of the invention, as shown in FIG. 8, the first pre-decoding unit 11 may include, for example, first to fifth logic circuits 11-1 to 11-5. In this exemplary embodiment, the first logic circuit 11-1 generates two status values of each of the column addresses COL_ADD<0:1>, i.e., an original phase and an inverted phase. The first logic circuit 11-1 includes first to fourth inverters IV11 to IV14.

In the exemplary embodiment, the second to fifth logic circuits 11-2 to 11-5 may combine the possible bit combination of the column address COL_ADD<0:1> that are generated by the first logic circuit 11-1 (i.e., low/low, low/high, high/low, high/high) with the bank information signal STB<0:1> to generate the up pre-decoding signal PRE_ADD_UP<0:3> and the down pre-decoding signal PRE_ADD_DN<0:3>. The second logic circuit 11-2 may include, for example, a first NAND gate ND21 that receives an inverted column address COL_ADDb<0> and an inverted column address COL_ADDb<1>, a first inverter IV21 that receives output of the first NAND gate ND21, a second NAND gate ND22 that receives the bank information signal STB<0> and output of the first inverter IV21, a second inverter IV22 that receives output of the second NAND gate ND22 and outputs the up pre-decoding signal PRE_ADD_UP<0>, a third NAND gate ND23 that receives the bank information signal STB<1> and the output of the first inverter IV21, and a third inverter IV23 that receives the output of the third NAND gate ND23 and outputs the down pre-decoding signal PRE_ADD_DN<0>.

The third to fifth logic circuits 11-3 to 11-5 may have the same structure as the second logic circuit 11-2.

Referring now to FIG. 9, the exemplary second pre-decoding unit 12 is shown including first to fifth logic circuits 12-1 to 12-5. The first logic circuit 12-1 may generate two status values of each of the column addresses COL_ADD<2:3>, i.e., an original phase and an inverted phase. The first logic circuit 12-1 may include first to fourth inverters IV15 to IV18.

In the exemplary embodiment, the second to fifth logic circuits 12-2 to 12-5 may combine the possible bit combinations of the column address COL_ADD<2:3> that are generated by the first logic circuit 12-1 (i.e., low/low, low/high, high/low, high/high) to generate the first pre-decoding signal PRE_ADD_1<0:3>. The second logic circuit 12-2 may include a NAND gate ND61 that receives an inverted column address COL ADDb<2> and an inverted column address COL_ADDb<3>, and an inverter IV61 that receives output of the NAND gate ND61 and outputs the first pre-decoding signal PRE_ADD_1<0>. The third to fifth logic circuits 12-3 to 12-5 may have the same structure as the second logic circuit 12-2.

According to an embodiment of the invention, the third pre-decoding unit 13 has the same structure as the second pre-decoding unit 12 except for the input signals.

An example of the column decoding operation of the semiconductor memory apparatus according to the embodiment of the present invention that has the above-described structure will now be described.

According to an embodiment of the present invention, the upper zeroth bank BANK0 and the lower first bank BANK1 shown in FIG. 4 share the column decoder.

The pre-decoder 10 of the column decoder decodes the column address COL_ADD<0:5> and the bank information signal STB<0:1> and generates the up pre-decoding signal PRE_ADD_UP<0:3> and the down pre-decoding signal PRE_ADD_DN<0:3> for differentiating BANK0 from BANK1, and the first and second pre-decoding signal PRE_ADD_1<0:3> and PRE_ADD_2<0:3>.

When the bank address BA<0> is at a logic high level, the bank information signal STB<0> becomes a logic high, and the bank information signal STB<1> becomes a logic low.

When the bank information signal STB<0> is at a logic high level, any one of the bits of the up pre-decoding signal PRE_ADD_UP<0:3> becomes a logic high. All of the bits of the down pre-decoding signal PRE_ADD_DN<0:3> become a logic low.

The first main decoding unit 20 decodes the up pre-decoding signal PRE_ADD_UP<0:3>, whose one bit is at a logic high, and the first and second pre-decoding signals PRE_ADD_1<0:3> and PRE_ADD_2<0:3>, and outputs the up column selection signal YI_UP<0:63> to BANK0. Any one of the bits of the up column selection signal YI_UP<0:63> is activated at a high level. According to the up column selection signal YI_UP<0:63>, a data read or write operation is performed on BANK0. On the other hand, all of the bits of the down column selection signal YI_DN<0:63> are inactivated at a logic low.

Meanwhile, when the bank address BA<1> is at a logic high, the bank information signal STB<1> becomes a logic high, and the bank information signal STB<0> becomes a logic low. When the bank information signal STB<1> is at a logic high, any one of the bits of the down pre-decoding signal PRE_ADD_DN<0:3> becomes a logic high.

Also, each of the bits of the pre-decoding signal PRE_ADD_UP<0:3> becomes a logic low. The second main decoding unit 30 decodes the down pre-decoding signal PRE_ADD_DN<0:3>, whose one bit is at a logic high, and the first and second pre-decoding signals PRE_ADD_1<0:3> and PRE_ADD_2<0:3>, and activates the down column selection signal YI_DN<0:63> output to BANK1 at a logic high. According to the down column selection signal YI_DN<0:63>, a data read or write operation is performed on BANK1. In the meantime, the bits of the up column selection signal YI_UP<0:63> are inactivated at a logic low.

As described above, according to the embodiment of the present invention, the column addresses are decoded using a lower number of column decoders than there are banks, such that a column selection operation can be performed on a plurality of banks.

As shown in FIGS. 10 and 11, in the semiconductor memory apparatuses according to the embodiments of the present invention, a column decoder may be arranged between every two banks. Unlike the conventional decoder arrangements, the number of pre-decoders may be smaller than the number of main decoders. According to this embodiment of the present invention, two banks may share one column decoder, and a plurality of main decoders may share one pre-decoder. Therefore, the column decoder and the semiconductor memory apparatus using the same according to the embodiments of the present invention can reduce the area of the column decoder.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

As described above, since the column decoder and the semiconductor memory apparatus using the same according to the embodiments of the present invention can reduce the number of pre-decoders, it is possible to reduce the area of the column decoder. Further, the reduction of the area in the column decoder leads to an increase in cell efficiency.

What is claimed is:

1. A semiconductor memory apparatus comprising:
   a first memory bank;
   a second memory bank;
   a pre-decoder configured to decode a column address and a bank information signal to generate a pre-decoding signal corresponding to the bank information signal; and
   a plurality of main decoders, each being configured to output a column selection signal generated by decoding the pre-decoding signal to at least one of the first memory bank or the second memory bank,
   wherein the pre-decoder includes:
   a first pre-decoding unit configured to decode a first plurality of bits of the column address and the bank information signal and output a bank identifying pre-decoding signal; and
   a second pre-decoding unit configured to decode a second plurality of bits of the column address and output a bank common pre-decoding signal.

2. The semiconductor memory apparatus of claim 1, wherein the plurality of main decoders are respectively coupled to a plurality of segments included in the first memory bank and the second memory bank.

3. The semiconductor memory apparatus of claim 1, wherein the first pre-decoding unit includes a plurality of logic circuits that combine a plurality of bit combinations of the first plurality of bits of the column address with the bank information signal to obtain the bank identifying pre-decoding signal.

4. The semiconductor memory apparatus of claim 3, wherein the plurality of logic circuits includes:
   a first logic circuit having an output and configured to perform an AND operation on the plurality of bit combinations of the first plurality of bits of the column address; and
   a plurality of second logic circuits configured to perform an AND operation on the output of the first logic circuit and each bit of the bank information signal.

5. The semiconductor memory apparatus of claim 1, wherein the second pre-decoding unit comprises a plurality of logic circuits configured to perform an AND operation on a plurality of bit combinations of the second plurality of bits of the column address.

6. The semiconductor memory apparatus of claim 1, wherein the bank information signals include a number of bits that are the same as a number of memory banks.

7. The semiconductor memory apparatus of claim 1, wherein the pre-decoder further comprises a signal generating unit configured to generate the bank information signal using a read or write command and a bank address.

8. The semiconductor memory apparatus of claim 7, wherein the signal generating unit comprises a plurality of logic circuits configured to perform a first AND operation on the read or write command and the bank address, and a second AND operation on the read or write command or an inverted bank address.

* * * * *